(12) United States Patent
Colbert et al.

(10) Patent No.: US 7,701,720 B2
(45) Date of Patent: Apr. 20, 2010

(54) ELECTRONIC ASSEMBLY AND TECHNIQUES FOR INSTALLING A HEATSINK IN AN ELECTRONIC ASSEMBLY

(75) Inventors: John L. Colbert, Byron, MN (US); John S. Corbin, Jr., Austin, TX (US); Jason R. Eagle, Kasson, MN (US); Arvind K. Sinha, Rochester, MN (US); Christopher L. Tuma, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 11/862,848

(22) Filed: Sep. 27, 2007

(65) Prior Publication Data

US 2009/0083972 A1 Apr. 2, 2009

(51) Int. Cl.
*H05K 7/20* (2006.01)
(52) U.S. Cl. .................. 361/719; 361/704; 361/707; 257/718; 257/719; 257/727; 165/80.3
(58) Field of Classification Search ............... 361/687, 361/688, 690, 704, 707, 719; 165/80.3; 257/718, 257/719, 727
See application file for complete search history.

(56) References Cited

U.S. PATENT DOCUMENTS

| | | | | |
|---|---|---|---|---|
| 5,757,621 | A * | 5/1998 | Patel | 361/719 |
| 5,901,039 | A * | 5/1999 | Dehaine et al. | 361/704 |
| 6,468,011 | B2 * | 10/2002 | Mayer | 411/353 |
| 6,611,431 | B1 * | 8/2003 | Lee et al. | 361/719 |
| 6,679,712 | B2 * | 1/2004 | Chang | 439/248 |
| 6,884,101 | B2 * | 4/2005 | Iannuzzelli et al. | 439/330 |
| 7,057,897 | B2 * | 6/2006 | Leu | 361/704 |
| 7,262,969 | B2 * | 8/2007 | Lee et al. | 361/704 |
| 7,342,796 | B2 * | 3/2008 | Aukzemas | 361/719 |
| 7,359,200 | B2 * | 4/2008 | Zhou et al. | 361/704 |
| 2005/0036289 | A1 * | 2/2005 | Lee et al. | 361/699 |
| 2005/0072558 | A1 * | 4/2005 | Whitney et al. | 165/80.3 |
| 2008/0158828 | A1 * | 7/2008 | Chen | 361/719 |
| 2009/0154110 | A1 * | 6/2009 | Ma et al. | 361/719 |

\* cited by examiner

*Primary Examiner*—Boris L Chervinsky
(74) *Attorney, Agent, or Firm*—Dillon & Yudell LLP; Roy W. Truelson

(57) ABSTRACT

A technique for installing a heatsink in an electronic assembly includes simultaneously applying force to multiple fastener assemblies that each retain a respective fastener in a body of the heatsink. The heatsink is then attached to the electronic assembly by actuating the fasteners while the force is simultaneously applied to the multiple fastener assemblies.

6 Claims, 4 Drawing Sheets

ELECTRONIC ASSEMBLY AND TECHNIQUES FOR INSTALLING A HEATSINK IN AN ELECTRONIC ASSEMBLY

BACKGROUND

1. Field

This disclosure relates generally to an electronic assembly and, more specifically to techniques for installing a heatsink in an electronic assembly.

2. Related Art

In a heatsink on electronic module (or integrated circuit (IC)) application, it has been observed that loading at corners of the heatsink has induced a bow in a base of the heatsink. This is due, at least in part, to loads being applied at some distance from an opposing surface which has caused a base of the heatsink to bend, which affects a planarity between the module and a pedestal of the heatsink. When the corners of a heatsink are loaded, the heatsink has bent concave down, which has increased a gap between a center of the module and the heatsink. This has also generally exposed corners of the module to higher pressure. In a typical electronic assembly there are four (one at each corner) loading mechanisms per heatsink. To gradually increase a heatsink load, fasteners at the corners of the heatsink have typically been cross-tightened during installation of the heatsink in the electronic assembly. While increasing corner loads on a heatsink incrementally provides relatively even heatsink loads, the heatsink loads are still concentrated at each corner of the heatsink as the fasteners are actuated, irrespective of how small the increment is on each of the fasteners. In a typical electronic assembly, load concentration has required special consideration to ensure that loads, which have acted on corners of an electronic module, have not cracked the corners of the module.

One approach for addressing the incremental loading problem has applied a central load to a top of a heatsink using a fixture and then actuated corner loading mechanisms of the heatsink. After the corner load mechanisms were tightened to their stops, the fixture was then removed. While applying a fixture load to a center of a heatsink has resulted in a relatively flat profile at a base of the heatsink (due to the applied load being directly over the opposing force (module)) during installation of the heatsink, applying a load to the center of the heatsink with a fixture has caused an employed thermal interface material (TIM) to be compressed to a profile that is representative of a centrally loaded system. Unfortunately, when the load is removed from the fixture, the heatsink has deflected to a bowed profile that has corresponded to a corner loaded heatsink. That is, a center of the heatsink has bowed up and away from the TIM (which was compressed to a fixed height when the fixture load was applied) which has lead to air entrapment between the heatsink pedestal and the TIM, e.g., thermal grease. Unfortunately, air bubbles between a TIM and a heatsink pedestal or module may lead to premature failure of the module due to the inability of the TIM to adequately transfer heat from the module to the heatsink.

SUMMARY

According to one aspect of the present disclosure, a technique for installing a heatsink in an electronic assembly includes simultaneously applying force to multiple fastener assemblies that each retain a respective fastener in a body of the heatsink. The heatsink is then attached to the electronic assembly by actuating the fasteners while the force is simultaneously applied to the multiple fastener assemblies.

According to another aspect of the present disclosure, an electronic assembly includes a heatsink body, multiple fastener assemblies, a substrate, and an integrated circuit. The multiple fastener assemblies each retain a respective fastener in the heatsink body. In this embodiment, the respective fastener is a machine screw and each of the multiple fastener assemblies include a spring that is configured to receive the machine screw and a snap ring that is configured to engage a groove formed in the machine screw to retain the machine screw in the heatsink in a spring-loaded manner. The substrate includes one or more electrically conductive traces. The integrated circuit includes a first face with electrically conductive contacts that are electrically coupled to one or more of the electrically conductive traces of the substrate and a second face that is opposite the first face. A pedestal of the heatsink is in thermal contact with the second face of the integrated circuit and the pedestal of the heatsink substantially maintains an installation contact profile with the second face of the integrated circuit following completion of installation of the heatsink in the electronic assembly.

BRIEF DESCRIPTION OF THE DRAWINGS

The present invention is illustrated by way of example and is not intended to be limited by the accompanying figures, in which like references indicate similar elements. Elements in the figures are illustrated for simplicity and clarity and have not necessarily been drawn to scale.

DETAILED DESCRIPTION

As will be appreciated by one of ordinary skill in the art, the present invention may be embodied as a method, system, or device. According to various disclosed techniques, while heatsink bowing associated with four corner loading may still be present in an electronic assembly, cross-tightening of heatsink fasteners is not required. It should be appreciated that dispatching with the need to cross-tighten heatsink fasteners reduces the possibility of damage to the electronic assembly due to lack of control in the fastener tightening process. According to various aspects of the present disclosure, a heatsink is uniformly loaded by a fixture in the same manner that the heatsink is loaded by heatsink fasteners during normal operation of an associated electronic assembly. Finite element analysis involving static, dynamic, and thermal cycling shows relatively low heatsink base deformation, relatively even distribution of thermal interface material (TIM), and subsequent low stresses for the techniques disclosed herein. According to disclosed heatsink installation approaches, a fixture applied force deflects a heatsink to a shape that is characteristic of a shape the heatsink maintains after the heatsink fasteners are engaged and a load fixture is removed. Accordingly, TIM problems associated with heatsink pedestal deflection (to an alternate shape after load fixture removal) are alleviated.

Figure 1:
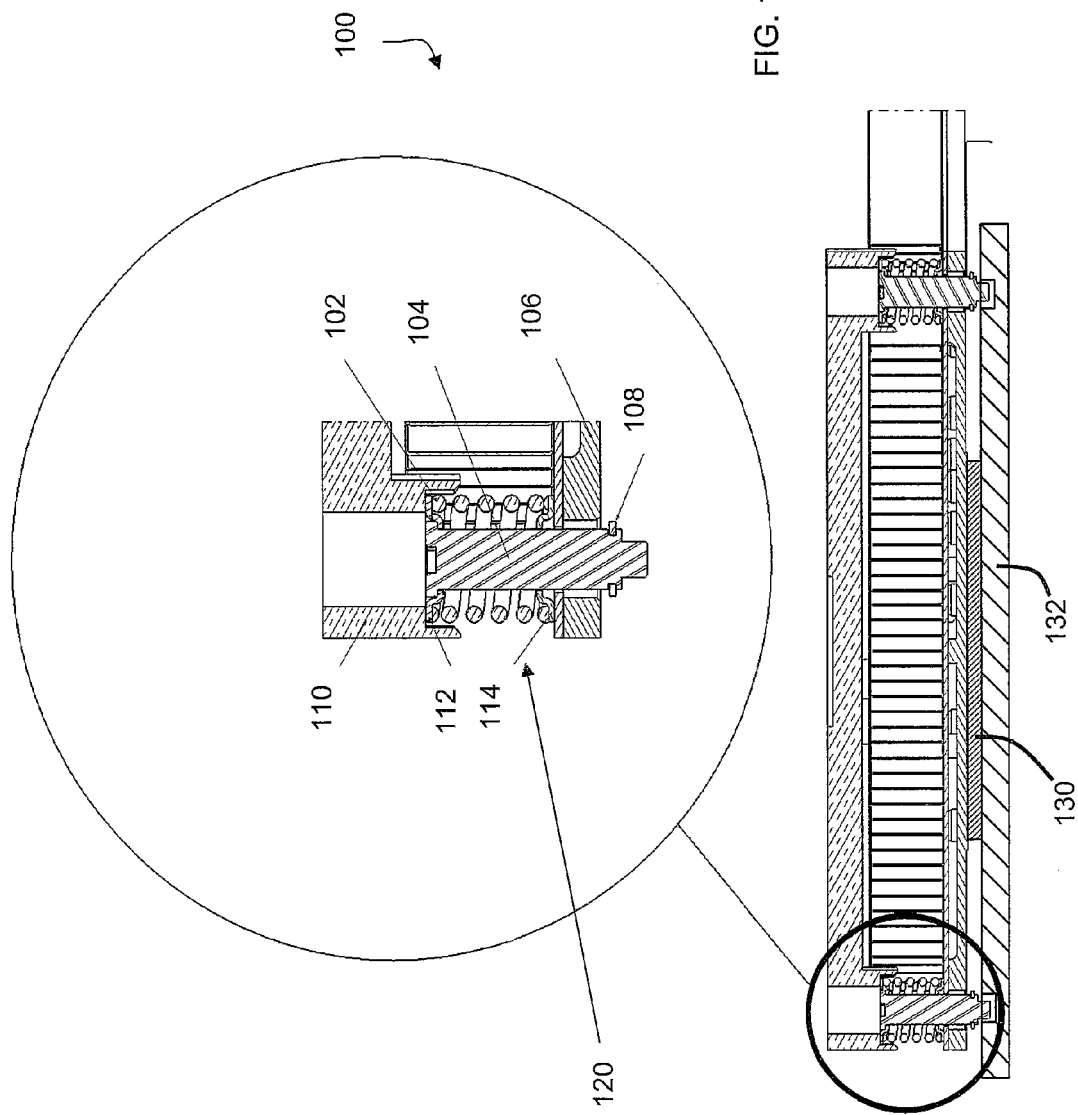
FIG. 1 is a cross-sectional view of a relevant portion of an example electronic assembly that includes a heatsink that is configured and installed in accordance with various aspects of the present disclosure.
Figure 2:
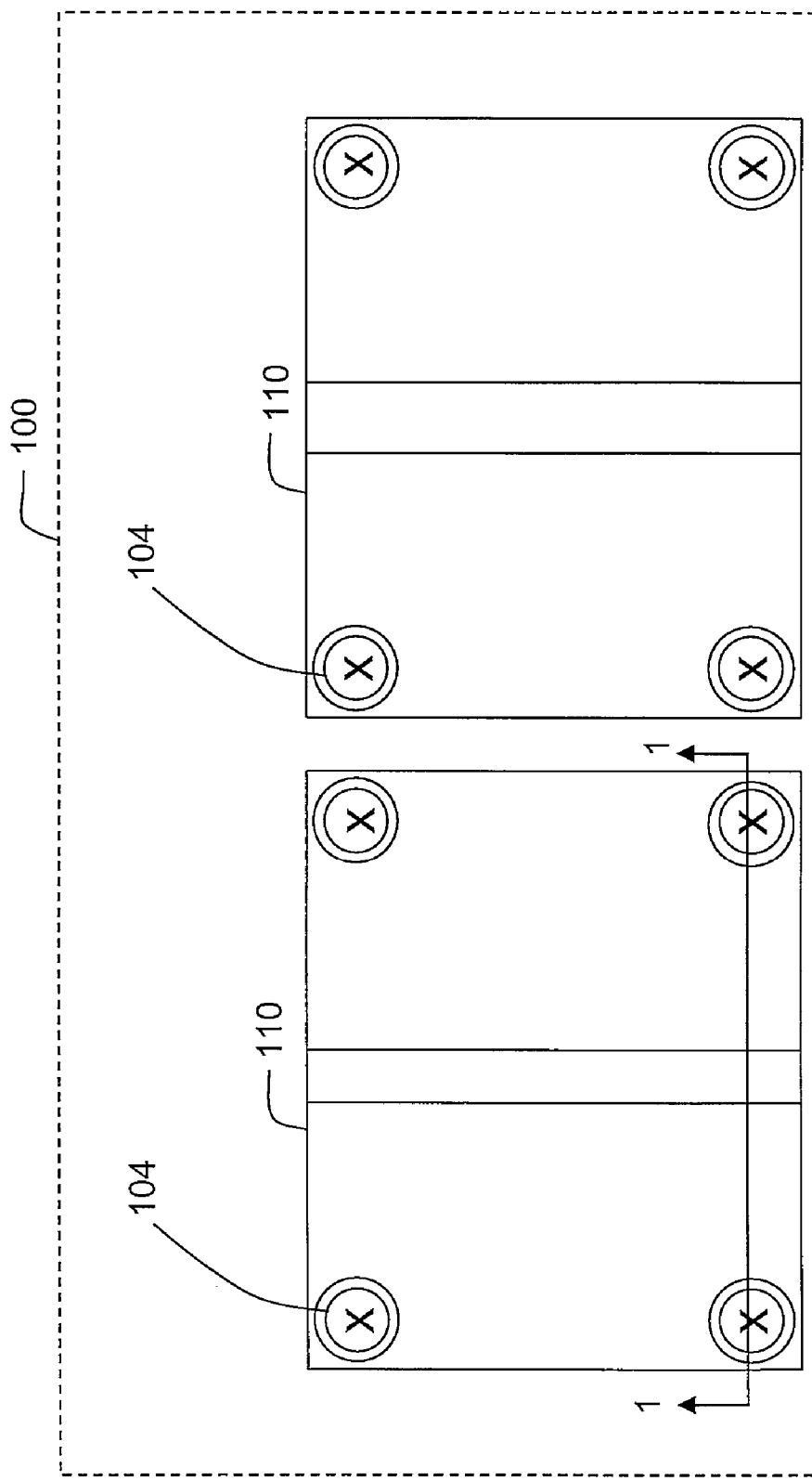
FIG. 2 is a top view of a relevant portion of the electronic assembly of FIG. 1.

With reference to FIGS. 1 and 2, cross-sectional and top views, respectively, of a relevant portion of an electronic assembly 100 that includes a heatsink 106, configured according to the present disclosure, is illustrated. A relevant portion of an assembly tool (load fixture) 110, which includes locating features (not shown) is depicted as being positioned over fastener retaining assemblies 120. It should be appreciated that two other fastener retaining assemblies 120 (not shown), located at opposite sides of the heatsink 106, are also employed. Moreover, it is contemplated that the techniques disclosed herein are applicable to electronic assemblies whose heatsinks are retained at positions other than the corners of the heatsinks or at other locations in addition to the corners of the heatsink. During installation of the heatsink 106 in the electronic assembly 100, a fixed load (not shown) is applied to the center of the fixture 110. The fastener retaining assemblies 120 each includes two flange washers 112 and 114.

The fixture 110 pushes down against the upper flange washer 112 in each of the fastener retaining assemblies 120. The upper flange washer 112 centers a head of fastener (e.g., a machine screw) 104, and is used to compress spring 102. The lower flange washer 114 bears against a base of the heatsink 106. The springs 102 are compressed a fixed distance, which corresponds to a designed load on the heatsink 106. It should be noted that each of the upper flange washers 112, the springs 102, and the fixture 110 move independent of the screws 104, i.e., the upper flange washers 112, the springs 102 and the fixture 110 have radial clearance. When the springs 102 are compressed, the screws 104 are not constrained and are, thus, able to freely turn.

Once the springs 102 are displaced to a designed load, the screws 104 are actuated until a head of the screws 104 touches an associated one of the displaced upper flange washers 112. The screws 104 may be actuated to mechanically connect the heatsink 106 to rails (not shown) that are located in slots of substrate 132. The rails may be mechanically connected to a chassis that houses the assembly 100. When all four screws 104 have been actuated in this manner, the fixture 110 is removed. As is shown in FIG. 1, snap rings 108 are employed to retain the fastener retaining assemblies 120 in the heatsink 106. In practice, the springs 102 exert some preload against the heads of the screws 104 in their free state. This serves to keep the components of the fastener retaining assemblies 120 centered, as well as keeping the threaded portion of the screws 104 raised. This prevents the threaded portion of the screws 104 from interfering with alignment (alignment dowels may be employed to facilitate alignment) of the heatsink 106 with module (e.g., integrated circuit) 130, which is electrically coupled to substrate 132. When the springs 102 are compressed, the screws 104 are free to lower into position. While the description herein describes the fasteners as machine screws, it is contemplated that other types of known fasteners may be employed.

Figure 3:
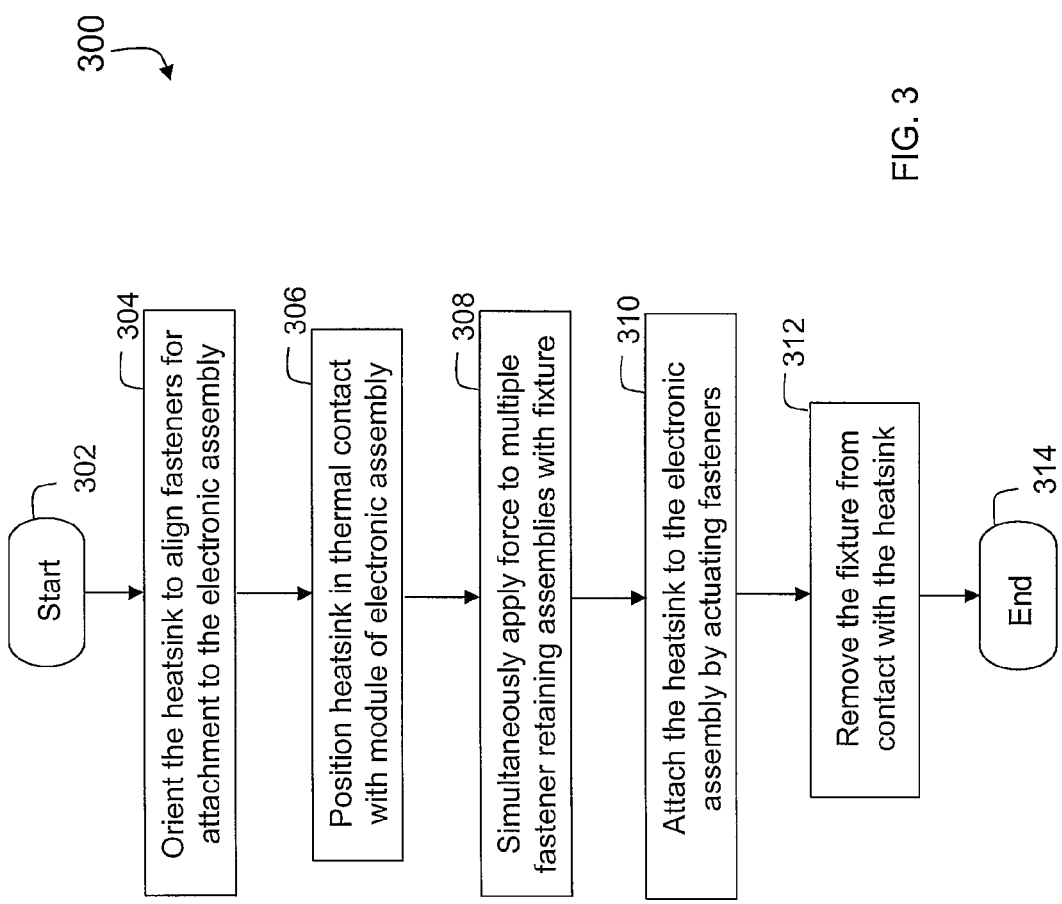
FIG. 3 is a flowchart of an example process for installing a heatsink in an electronic assembly according to various embodiments of the present disclosure.

Moving to FIG. 3, an example heatsink installation process 300 for installing a heatsink in an electronic assembly, according to various aspects of the present disclosure, is illustrated. To facilitate understanding, the process 300 is discussed in conjunction with FIGS. 1 and 2. In block 302, the process 300 is initiated at which point control transfers to block 304. In block 304, the heatsink 106 is oriented to align fasteners that are captured in the heatsink 106 for attachment to the electronic assembly 100. Next, in block 306, a pedestal of the heatsink 106 is positioned in thermal contact with the module (e.g., an integrated circuit such as an organic ball grid array (BGA)) 130, which includes electrically conductive contacts that are electrically coupled to electrically conductive traces of the substrate 132 (e.g., a printed circuit board (PCB)). Then, in block 308, the fixture 110 is aligned with the heatsink 106 and a force is applied to the fixture 110 which effectively applies a simultaneous force to the multiple fastener assemblies 120 associated with the heatsink 106. Next, in block 310, the heatsink 106 is attached to (integrated with) the electronic assembly 100 by actuating the fasteners 104. Then, in block 312, the fixture 110 is removed from contact with the heatsink 106. Following block 312, control transfers to block 314 where the process 300 terminates.

Figure 4:
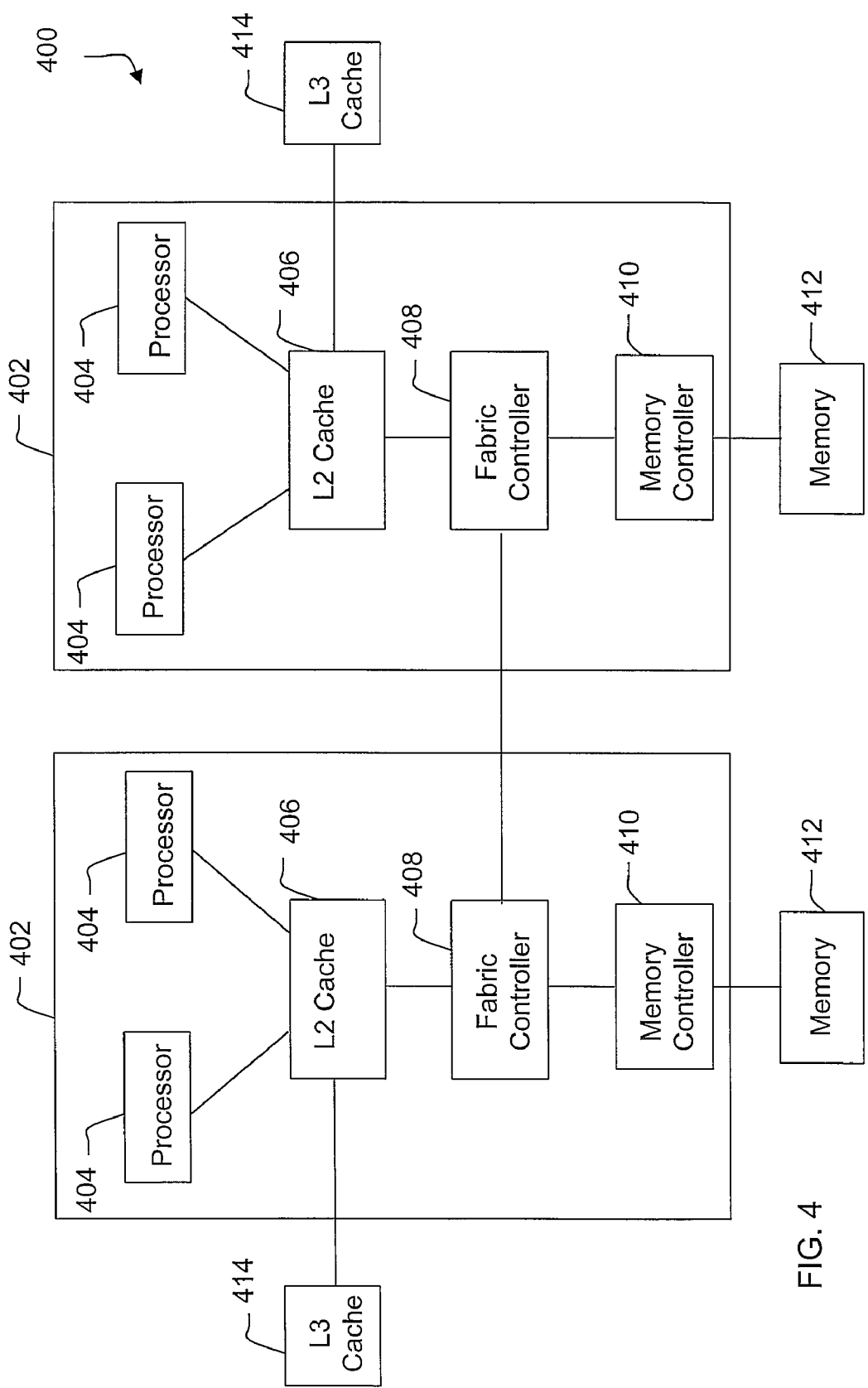
FIG. 4 is a block diagram of a computer system that may include one or more electronic assemblies configured according to various embodiments of the present disclosure.

With reference to FIG. 4, an example processor system 400 is illustrated that may incorporate one or more electronic assemblies that include heatsinks configured and installed according to the present disclosure. The processor system 400 includes two chip-level multiprocessors (Camps) 402, each of which includes two processors 404. In at least one embodiment, the processors 404 each include a first level (L1) cache memory (not separately shown) that is coupled to a shared second level (L2) cache memory (cache) 406, which is coupled to a third level (L3) cache 414 and a fabric controller 408. The fabric controller 408 is coupled to a memory controller 410, which is coupled to a memory subsystem 412. The memory subsystem 412 includes an application appropriate amount of volatile and non-volatile memory. The fabric controller 408 facilitates communication between different ones of the Camps 402 and between the processors 404 and the memory subsystem 412 and in this manner functions as an interface.

Accordingly, a heatsink and techniques for installing a heatsink have been disclosed herein that readily provide for installation of a heatsink in a wide variety of electronic assemblies.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," (and similar terms, such as includes, including, has, having, etc.) are open-ended when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. A method of installing a heatsink in an electronic assembly, comprising:

simultaneously applying, with an assembly fixture, a respective assembly loading force to each of multiple fastener assemblies that are each configured to retain a respective fastener in a body of the heatsink, each respective assembly loading force being equivalent to a corresponding designed load for retaining the heatsink to the electronic assembly;

attaching the heatsink to the electronic assembly by actuating the respective fastener of each of the multiple fastener assemblies to a respective assembled position in which each fastener provides the corresponding designed load for retaining the heatsink to the electronic assembly, said actuating the respective fastener of each of the multiple fastener assemblies being performed while the assembly loading force is simultaneously applied to the multiple fastener assemblies by said assembly fixture; and removing the assembly fixture, wherein each said multiple fasteners is left in said respective assembled position applying said respective corresponding designed load.

2. The method of claim 1, wherein the electronic assembly includes a substrate and an integrated circuit mounted to the substrate and the method further comprises:

orienting the heatsink to align the respective fastener of each of the multiple fastener assemblies for attachment to the electronic assembly; and positioning a portion of the heatsink in thermal contact with a face of the integrated circuit, wherein the face is parallel to and projecting above the plane of the substrate.

3. The method of claim 1, wherein the respective fastener of each of the multiple fastener assemblies is a machine screw and each of the multiple fastener assemblies include a spring that is configured to receive the machine screw and a snap ring that is configured to engage a groove formed in the machine screw to retain the machine screw in the heatsink in a spring-loaded manner.

4. The method of claim 3, wherein each of the multiple fastener assemblies further include a first washer located between a head of the machine screw and the spring and a second washer located between the spring and the heatsink.

5. The method of claim 4, wherein the first and second washers each include an aperture configured to receive the machine screw and a flange that is configured to be received inside the spring.

6. The method of claim 1, wherein the multiple fastener assemblies are located approximate respective corners of the heatsink.

* * * * *